United States Patent
Shim et al.

(10) Patent No.: US 9,142,697 B2
(45) Date of Patent: Sep. 22, 2015

(54) SOLAR CELL

(75) Inventors: Seunghwan Shim, Seoul (KR); Jinah Kim, Seoul (KR); Jeongbeom Nam, Seoul (KR); Indo Chung, Seoul (KR); Juhong Yang, Seoul (KR); Ilhyoung Jung, Seoul (KR); Hyungjin Kwon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 323 days.

(21) Appl. No.: 13/345,155

(22) Filed: Jan. 6, 2012

(65) Prior Publication Data

US 2012/0180861 A1 Jul. 19, 2012

(30) Foreign Application Priority Data

Jan. 18, 2011 (KR) .......................... 10-2011-0004862

(51) Int. Cl.
*H01L 31/0224* (2006.01)
*H01L 31/068* (2012.01)
*H01L 31/18* (2006.01)

(52) U.S. Cl.
CPC ...... *H01L 31/022433* (2013.01); *H01L 31/068* (2013.01); *H01L 31/1804* (2013.01); *Y02E 10/547* (2013.01)

(58) Field of Classification Search
CPC ............. H01L 31/065; H01L 31/022433; H01L 31/0352; H01L 31/03529
See application file for complete search history.

(56) References Cited

U.S. PATENT DOCUMENTS

| | | | | |
|---|---|---|---|---|
| 4,916,503 A | * | 4/1990 | Uematsu et al. | 257/436 |
| 6,084,175 A | * | 7/2000 | Perry et al. | 136/256 |
| 6,147,297 A | * | 11/2000 | Wettling et al. | 136/256 |
| 2005/0199995 A1 | | 9/2005 | Nomoto et al. | |
| 2008/0092944 A1 | * | 4/2008 | Rubin | 136/252 |
| 2009/0183768 A1 | * | 7/2009 | Wenham et al. | 136/256 |
| 2009/0283145 A1 | * | 11/2009 | Kim et al. | 136/261 |
| 2010/0108129 A1 | * | 5/2010 | Ahn et al. | 136/255 |
| 2010/0193016 A1 | * | 8/2010 | Fernandez et al. | 136/255 |
| 2010/0243041 A1 | * | 9/2010 | Carlson et al. | 136/255 |
| 2010/0282310 A1 | * | 11/2010 | Tsoi et al. | 136/255 |
| 2011/0146782 A1 | * | 6/2011 | Gabor et al. | 136/256 |
| 2011/0189810 A1 | * | 8/2011 | Rubin et al. | 438/72 |
| 2013/0000705 A1 | * | 1/2013 | Shappir | 136/255 |

FOREIGN PATENT DOCUMENTS

| | | | |
|---|---|---|---|
| JP | 2005-353821 A | 12/2005 | |
| JP | 2006-128290 A | 5/2006 | |

(Continued)

*Primary Examiner* — Jeffrey T Barton
*Assistant Examiner* — Eric R Smith
(74) *Attorney, Agent, or Firm* — Birch, Stewart, Kolasch & Birch, LLP

(57) ABSTRACT

A solar cell includes a substrate of a first conductive type, an emitter region, which is positioned at the substrate and is doped with impurities of a second conductive type opposite the first conductive type, a plurality of first electrodes, which are connected to the emitter region and extend parallel to one another to be spaced apart from one another, a plurality of semiconductor electrodes, which extend in a direction different from an extension direction of the plurality of first electrodes to be spaced apart from one another and have an impurity doping concentration higher than the emitter region, and a second electrode connected to the substrate. A distance between two adjacent semiconductor electrodes is about 0.02 cm to 0.2 cm, and a distance between two adjacent first electrodes is about 0.3 cm to 0.8 cm.

6 Claims, 9 Drawing Sheets

(56) References Cited

FOREIGN PATENT DOCUMENTS

| JP | 2008-135655 A | 6/2008 |
| JP | 2010056241 A | * 3/2010 |
| KR | 10-2010-0090316 A | 8/2010 |

* cited by examiner

SOLAR CELL

This application claims priority to and the benefit of Korean Patent Application No. 10-2011-0004862, filed in the Korean Intellectual Property Office on Jan. 18, 2011, the entire content of which is incorporated herein by reference.

BACKGROUND OF THE INVENTION

1. Field of the Invention

Embodiments of the invention relate to a solar cell.

2. Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

A solar cell generally includes semiconductor parts, which have different conductive types, for example, a p-type and an n-type, and form a p-n junction, and electrodes respectively connected to the semiconductor parts of the different conductive types.

When light is incident on the solar cell, electron-hole pairs are generated in the semiconductor parts. The electrons and the holes move under the influence of the p-n junction to the n-type semiconductor part and the p-type semiconductor part, respectively. The electrons and the holes are collected by the electrodes connected to the n-type semiconductor part and the p-type semiconductor part, respectively. The electrodes are connected to each other using electric wires to thereby obtain electric power.

SUMMARY OF THE INVENTION

In one aspect, there is a solar cell including a substrate of a first conductive type, an emitter region, which is positioned at the substrate and is doped with impurities of a second conductive type opposite the first conductive type, a plurality of first electrodes, which are connected to the emitter region and extend parallel to one another to be spaced apart from one another, a plurality of semiconductor electrodes, which extend in a direction different from an extension direction of the plurality of first electrodes to be spaced apart from one another and have an impurity doping concentration higher than the emitter region, and a second electrode connected to the substrate, wherein a distance between two adjacent semiconductor electrodes is about 0.02 cm to 0.2 cm, and a distance between two adjacent first electrodes is about 0.3 cm to 0.8 cm.

The distance between the two adjacent semiconductor electrodes may be greater than about 0.2 cm and equal to or less about 0.23 cm, and the distance between the two adjacent first electrodes may be about 0.3 cm to 0.7 cm. The distance between the two adjacent semiconductor electrodes may be greater than about 0.23 cm and equal to or less about 0.27 cm, and the distance between the two adjacent first electrodes may be about 0.3 cm to 0.6 cm. The distance between the two adjacent semiconductor electrodes may be greater than about 0.27 cm and equal to or less about 0.3 cm, and the distance between the two adjacent first electrodes may be about 0.4 cm to 0.5 cm.

The plurality of semiconductor electrodes may extend in a direction perpendicular to the plurality of first electrodes.

In another aspect, there is a solar cell including a substrate of a first conductive type, an emitter region, which is positioned at the substrate and is doped with impurities of a second conductive type opposite the first conductive type, a plurality of first electrodes, which are connected to the emitter region and extend parallel to one another to be spaced apart from one another, a plurality of semiconductor electrodes including a plurality of first portions, which extend in a first direction different from an extension direction of the plurality of first electrodes, and a plurality of second portions, which extend in a second direction different from the first direction, the plurality of semiconductor electrodes each having an impurity doping concentration higher than the emitter region, and a second electrode connected to the substrate, wherein a distance between two adjacent first portions is about 0.01 cm to 0.35 cm, and a distance between two adjacent second portions is about 0.01 cm to 0.4 cm. A distance between the two adjacent first electrodes may be about 0.2 cm to 1.2 cm. The first direction may be perpendicular to the second direction.

The second direction may be substantially the same as the extension direction of the plurality of first electrodes.

The emitter region may have a sheet resistance of about 70 $\Omega$/sq. to 90 $\Omega$/sq., and each of the plurality of semiconductor electrodes may have a sheet resistance of about 5 $\Omega$/sq. to 15 $\Omega$/sq.

Each of the plurality of first electrodes may have a width of about 80 $\mu$m to 120 $\mu$m.

Each of the plurality of semiconductor electrodes may have a width of about 20 $\mu$m to 40 $\mu$m.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 7 is the graph illustrating an example when the distance between the two adjacent first portions is about 0.01 cm, FIG. 8 is the graph illustrating an example when the distance between the two adjacent first portions is about 0.11 cm, and FIG. 9 is the graph illustrating an example when the distance between the two adjacent first portions is about 0.35 cm.

DETAILED DESCRIPTION OF THE EMBODIMENTS

Figure 1:
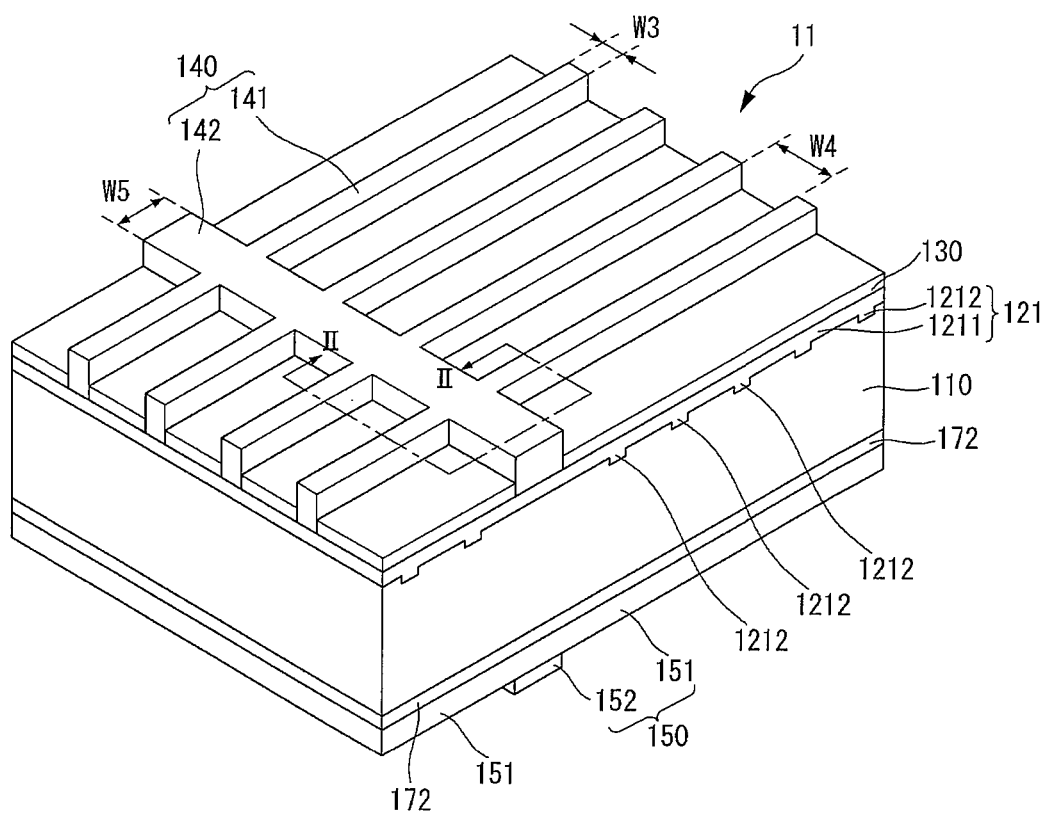
FIG. 1 is a partial perspective view of a solar cell according to an example embodiment of the invention.

Embodiments of the invention will be described more fully hereinafter with reference to the accompanying drawings, in which example embodiments of the invention are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on another element, it may be on the entire surface of the other element and may be not on a portion of an edge of the other element.

A solar cell according to an example embodiment of the invention is described below with reference to FIGS. 1 and 2.

Figure 2:
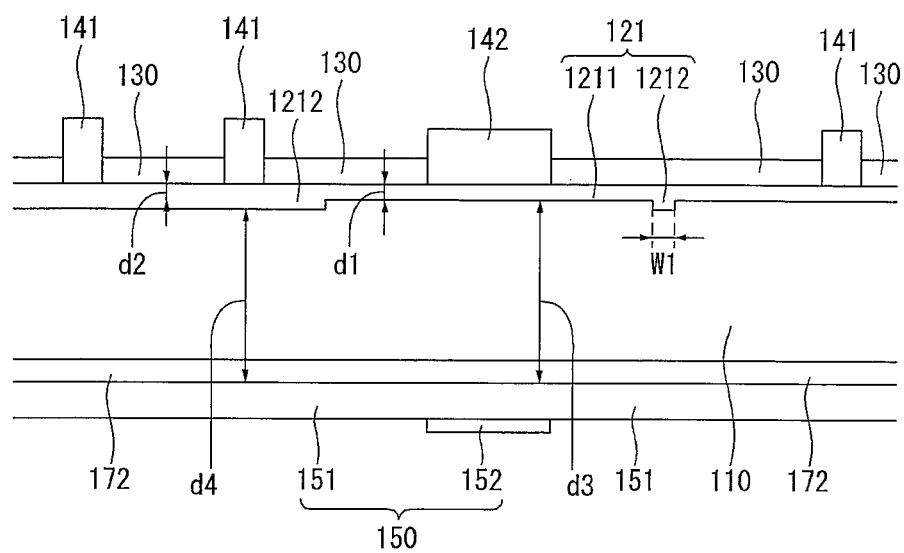
FIG. 2 is a cross-sectional view taken along line II-II of FIG. 1.

As shown in FIGS. 1 and 2, a solar cell 11 according to an example embodiment of the invention includes a substrate 110, an impurity doped region 121 positioned at an incident surface (hereinafter, referred to as "a front surface") of the substrate 110 on which light is incident, an anti-reflection layer 130 positioned on the impurity doped region 121, a front electrode part 140 connected to the impurity doped region 121, a back surface field (BSF) region 172 positioned at a surface (hereinafter, referred to as "a back surface") opposite the front surface of the substrate 110, and a back electrode part 150 positioned on the back surface of the substrate 110.

The substrate 110 is a semiconductor substrate formed of single crystal silicon of a first conductive type, for example, p-type, though not required. When the substrate 110 is of the p-type, the substrate 110 may be doped with impurities of a group III element such as boron (B), gallium (Ga), and indium (In). Alternatively, the substrate 110 may be of an n-type. When the substrate 110 is of the n-type, the substrate 110 may be doped with impurities of a group V element such as phosphorus (P), arsenic (As), and antimony (Sb).

Unlike FIGS. 1 and 2, in an alternative example, the front surface of the substrate 110 may be textured to form a textured surface corresponding to an uneven surface or having uneven characteristics. In this instance, the impurity doped region 121 and the anti-reflection layer 130 positioned on the front surface of the substrate 110 may have the textured surface having the plurality of uneven portions.

As described above, when the front surface of the substrate 110 is textured, an incident area of the substrate 110 increases and a light reflectance decreases because of a plurality of reflection operations resulting from the textured surface. Hence, an amount of light incident on the substrate 110 increases, and the efficiency of the solar cell 11 is improved.

The impurity doped region 121 is a region obtained by doping the substrate 110 with impurities of a second conductive type (for example, n-type) opposite the first conductive type (for example, p-type) of the substrate 110. The impurity doped region 121 is positioned at the front surface of the substrate 110 on which light is incident. Thus, the impurity doped region 121 of the second conductive type forms a p-n junction along with a first conductive type region of the substrate 110.

The impurity doped region 121 includes a first impurity doped region 1211 and a plurality of second impurity doped regions 1212. An impurity doping thickness of the first impurity doped region 1211 is different from an impurity doping thickness of each second impurity doped region 1212.

In the embodiment of the invention, the impurity doping thickness of the first impurity doped region 1211 is less than the impurity doping thickness of the second impurity doped region 1212. As above, because the impurity doping thickness of the first impurity doped region 1211 is different from the impurity doping thickness of the second impurity doped region 1212, an impurity doping concentration of the first impurity doped region 1211 is different from an impurity doping concentration of the second impurity doped region 1212. Thus, the impurity doping concentration of the first impurity doped region 1211 is less than the impurity doping concentration of the second impurity doped region 1212.

As above, because the impurity doping thicknesses of the first and second impurity doped regions 1211 and 1212 are different from each other, a shortest distance d1 between a surface (a contact surface between a front electrode 141 or the anti-reflection layer 130 and the first impurity doped region 1211) of the substrate 110 and a p-n junction surface (hereinafter, referred to as "a first junction surface") between the first impurity doped region 1211 and the substrate 110 is different from a shortest distance d2 between a surface (a contact surface between the anti-reflection layer 130 or the front electrode 141 and the second impurity doped region 1212) of the substrate 110 and a p-n junction surface (hereinafter, referred to as "a second junction surface") between the second impurity doped region 1212 and the substrate 110. For example, as shown in FIGS. 1 and 2, the first shortest distance d1 between the surface of the substrate 110 and the first junction surface is less than the second shortest distance d2 between the surface of the substrate 110 and the second junction surface.

Further, the first junction surface and the second junction surface inside the substrate 110 are positioned on different parallel lines that parallel the back surface of the substrate 110. Hence, a third shortest distance d3 between the back surface of the substrate 110 and the first junction surface is different from a fourth shortest distance d4 between the back surface of the substrate 110 and the second junction surface. Namely, the third shortest distance d3 is greater than fourth shortest distance d4.

However, when the front surface of the substrate 110 is the textured surface, it is considered that the first and third shortest distances d1 and d3 and the second and fourth shortest distances d2 and d4 are substantially equal to each other within the margin of error obtained by a difference between the heights of the uneven portions of the textured surface.

Sheet resistances of the first and second impurity doped regions 1211 and 1212 are different from each other because of a difference between the impurity doping thicknesses of the first and second impurity doped regions 1211 and 1212. In general, the sheet resistance is inversely proportional to an impurity doping thickness. Therefore, in the embodiment of the invention, because the impurity doping thickness of the first impurity doped region 1211 is less than the impurity doping thickness of the second impurity doped region 1212, the sheet resistance of the first impurity doped region 1211 is greater than the sheet resistance of the second impurity doped region 1212. For example, the sheet resistance of the first impurity doped region 1211 may be approximately 70 $\Omega$/sq. to 90 $\Omega$/sq., and the sheet resistance of the second impurity doped region 1212 may be approximately 5 $\Omega$/sq. to 15 $\Omega$/sq.

Figure 3:
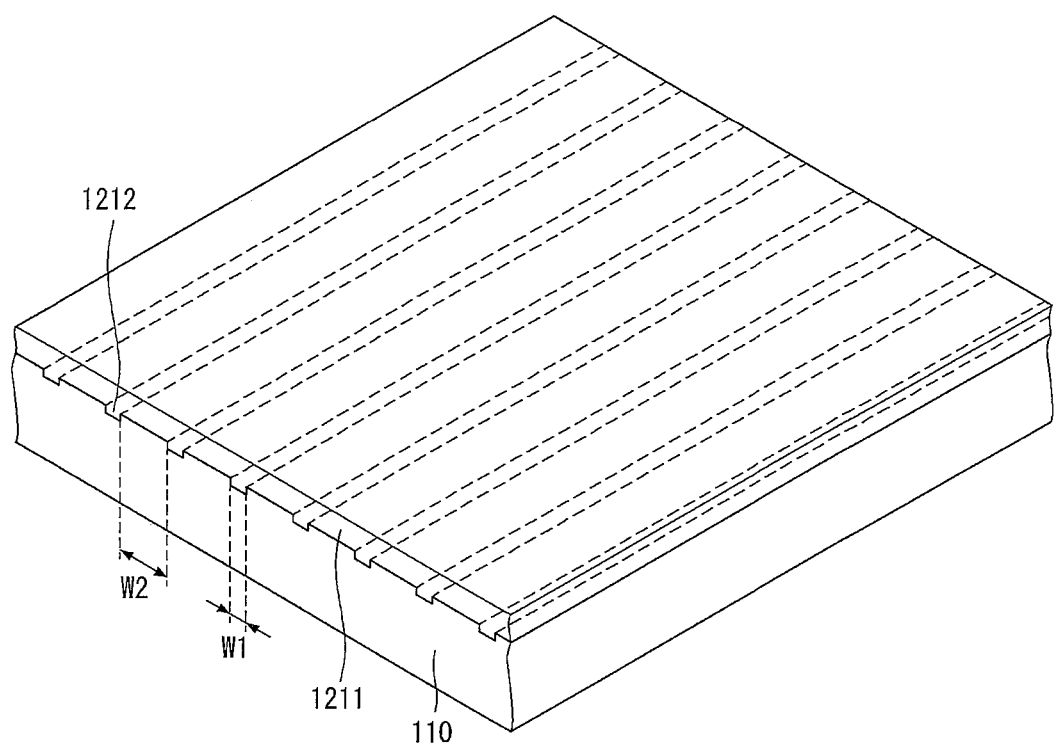
FIG. 3 is a partial perspective view of an emitter region according to an example embodiment of the invention.

As shown in FIGS. 1 to 3, the plurality of second impurity doped regions 1212 each having the relatively high impurity doping concentration are separated from one another and elongate (or extend) parallel to one another along a fixed direction of the substrate 110. Thus, the plurality of second impurity doped regions 1212 have a stripe shape.

A width W1 of each second impurity doped region 1212 is about 20 μm to 40 μm. A distance W2 between the two adjacent second impurity doped regions 1212 is about 0.02 cm to 0.25 cm.

Carriers, for example, electrons and holes produced by light incident on the substrate 110 move in corresponding directions by a built-in potential difference resulting from the p-n junction between the substrate 110 and the impurity doped region 121. Namely, the electrons move to the n-type semiconductor, and the holes move to the p-type semiconductor. Thus, when the substrate 110 is of the p-type and the impurity doped region 121 is of the n-type, the holes move to the back surface of the substrate 110 and the electrons move to the impurity doped region 121.

Because the impurity doped region 121 forms the p-n junction along with the substrate 110 (i.e., the first conductive type region of the substrate 110), the impurity doped region 121 may be of the p-type when the substrate 110 is of the n-type unlike the embodiment described above. In this instance, the electrons move to the back surface of the substrate 110 and the holes move to the impurity doped region 121.

Returning to the embodiment of the invention, when the impurity doped region 121 is of the n-type, the impurity doped region 121 may be formed by doping the substrate 110 with impurities of a group V element such as P, As, and Sb. On the contrary, when the impurity doped region 121 is of the p-type, the impurity doped region 121 may be formed by doping the substrate 110 with impurities of a group III element such as B, Ga, and In.

As above, when the electrons and the holes move by the p-n junction between the first conductive type region of the substrate 110 and the impurity doped region 121, a loss amount of carriers resulting from the moving direction of the carriers and the impurities vary because of the first and second impurity doped regions 1211 and 1212, each of which has the different sheet resistance and the different impurity doping concentration depending on a location of the impurity doped region 121.

In other words, the movement of carriers when the carries move through a portion of the impurity doped region 121 having the relatively low sheet resistance is generally easier than the movement of carriers when the carries move through a portion of the impurity doped region 121 having the relatively high sheet resistance. Further, as the impurity doping concentration of the impurity doped region 121 increases, the conductivity of the corresponding portion increases.

Accordingly, as in the embodiment of the invention, when the corresponding carriers (for example, electrons) move to the impurity doped region 121, carriers positioned in the first impurity doped region 1211 having the relatively high sheet resistance move to the second impurity doped regions 1212 which have the relatively low sheet resistance less than the first impurity doped region 1211 and are positioned close to the first impurity doped region 1211. In this instance, because the impurity doping concentration of the first impurity doped region 1211 is less than the impurity doping concentration of the second impurity doped regions 1212, a loss amount of carriers resulting from the impurities when the carriers move from the first impurity doped region 1211 to the second impurity doped regions 1212 is greatly reduced, compared to when the carriers move through the second impurity doped regions 1212.

As above, when the carriers positioned in the first impurity doped region 1211 move to the second impurity doped regions 1212, the carriers moving to the second impurity doped regions 1212 move along the second impurity doped regions 1212 extending in the corresponding direction because the conductivity of the second impurity doped regions 1212 is greater than the conductivity of the first impurity doped region 1211. Thus, the second impurity doped regions 1212 serve as a semiconductor electrode for transferring carriers.

Accordingly, the first and second impurity doped regions 1211 and 1212 form the p-n junction along with the substrate 110, and the first impurity doped region 1211 moves the generated carriers to the front electrode part 140 or the second impurity doped regions 1212 and is connected to the front electrode part 140 outputting the carriers. Therefore, the first impurity doped region 1211 serves as an emitter region, and the second impurity doped regions 1212 serve as the semiconductor electrode as described above.

A portion of the first impurity doped region 1211 adjoins the front electrode part 140, and the front electrode part 140 contains a metal. Therefore, the conductivity of the front electrode part 140 is much greater than the conductivity of the first and second impurity doped regions 1211 and 1212. Thus, carriers positioned in the first impurity doped region 1211 adjoining the front electrode part 140 or carriers adjacent to the front electrode part 140 move to the front electrode part 140.

As above, the carriers move to the front electrode part 140 through the first impurity doped region 1211 adjoining the front electrode part 140 and also move to the second impurity doped regions 1212 adjacent to the first impurity doped region 1211 because of the formation of the second impurity doped regions 1212. Hence, the carriers positioned in the first impurity doped region 1211 move to the front electrode part 140, and also move along the second impurity doped regions 1212 (serving as the semiconductor electrode) and then move to the front electrode part 140. In other words, because the carriers positioned in the first impurity doped region 1211 move to the second impurity doped regions 1212 as well as the front electrode part 140, the number of movable paths of the carriers increase and a movement distance thereof shortens. Thus, an amount of carriers lost when the carriers move to the corresponding impurity doped regions 1211 and 1212 decreases. As a result, an amount of carriers transferred to the front electrode part 140 increases.

When the sheet resistance of the first impurity doped region 1211 is about 70 Ω/sq. to 90 Ω/sq., an amount of light reaching the substrate 110 may increase because of the thin first impurity doped region 1211. Hence, an amount of carriers produced in the substrate 110 may increase, and the movement distance of the carriers may shorten. As a result, a recombination and/or a disappearance of electrons and holes may be prevented or reduced, and a short-circuit current density Jsc may increase.

Further, when the sheet resistance of the second impurity doped region 1212 is about 5 Ω/sq. to 15 Ω/sq., a contact resistance of the second impurity doped region 1212 decreases. Hence, when the second impurity doped region 1212 contacts the front electrode 141 positioned on the second impurity doped region 1212, a loss amount of carriers decreases. Further, a shunt error, in which the front electrodes 141 pass through the second impurity doped regions 1212 in the formation of the front electrodes 141 and contact the substrate 110, is prevented because of the thick second impurity doped regions 1212. Hence, a fill factor of the solar cell 11 is improved.

Further, because an amount of light absorbed in the second impurity doped regions 1212 is reduced, an amount of light incident on the substrate 110 increases.

The anti-reflection layer 130 positioned on the impurity doped region 121 reduces a reflectance of light incident on the solar cell 11 and increases selectivity of a predetermined wavelength band, thereby increasing the efficiency of the solar cell 11.

The anti-reflection layer 130 may be formed of transparent hydrogenated silicon nitride (SiNx). The anti-reflection layer 130 may have a thickness of about 70 nm to 80 nm and a refractive index of about 2.0 to 2.1.

When the refractive index of the anti-reflection layer 130 is equal to or greater than about 2.0, the reflectance of light decreases and an amount of light absorbed in the anti-reflection layer 130 further decreases. Further, when the refractive index of the anti-reflection layer 130 is equal to or less than about 2.1, the reflectance of light further decreases.

Further, in the embodiment of the invention, the anti-reflection layer 130 has a refractive index of about 2.0 to 2.1 that is between a refractive index (about 1) of air and a refractive index (about 3.6) of the substrate 110. Thus, because a refractive index going from air to the substrate 110 gradually increases, the reflectance of light further decreases by the gradual increase in the refractive index. As a result, an amount of light incident on the substrate 110 further increases.

When the thickness of the anti-reflection layer 130 is equal to or greater than about 70 nm, an anti-reflection effect of light is more efficiently obtained. When the thickness of the anti-reflection layer 130 is equal to or less than about 80 nm, an amount of light absorbed in the anti-reflection layer 130 decreases and an amount of light incident on the substrate 110 increases. Further, in the process for manufacturing the solar cell 11, the front electrode part 140 stably and easily passes through the anti-reflection layer 130 and is stably connected to the impurity doped region 121.

The anti-reflection layer 130 performs a passivation function that converts a defect, for example, dangling bonds existing at and around the surface of the substrate 110 into stable bonds using hydrogen (H) contained in the anti-reflection layer 130 to thereby prevent or reduce a recombination and/or a disappearance of carriers moving to the surface of the substrate 110. Hence, the anti-reflection layer 130 reduces an amount of carriers lost by the defect at the surface of the substrate 110.

The anti-reflection layer 130 shown in FIGS. 1 and 2 has a single-layered structure, but may have a multi-layered structure, for example, a double-layered structure in another embodiment. Further, the anti-reflection layer 130 may be omitted, if necessary or desired.

The front electrode part 140 includes a plurality of front electrodes 141 and a plurality of front bus bars 142 connected to the plurality of front electrodes 141. The plurality of front bus bars 142 and the plurality of front electrodes 141 may be arranged to intersect.

The plurality of front electrodes 141 are positioned on the first impurity doped region 1211 and are electrically and physically connected to the first impurity doped region 1211. The plurality of front electrodes 141 extend substantially parallel to one another in a fixed direction at a distance therebetween. Thus, the anti-reflection layer 130 does not exist under the plurality of front electrodes 141.

The plurality of front electrodes 141 are formed of at least one conductive material, for example, silver (Ag).

In the embodiment of the invention, a line width W3 of each front electrode 141 may be about 80 μm to 120 μm, and a distance W4 between the two adjacent front electrodes 141 may be about 0.3 cm to 0.8 cm.

When the line width W3 of the front electrode 141 is equal to or greater than about 80 μm, a line resistance of the front electrode 141 decreases and the conductivity of the front electrode 141 is stably secured. Hence, the movement of carriers is more stably performed, and the front electrode 141 is easily manufactured. Further, when the line width W3 of the front electrode 141 is equal to or less than about 120 μm, the incident area of light is stably secured and a reduction in a production amount of carriers resulting from a reduction in the incident area is reduced or prevented.

When the distance W4 between the two adjacent front electrodes 141 is equal to or greater than about 0.3 cm, the front electrode 141 stably collects the carriers because the incident area of light resulting from the front electrodes 141 is not greatly reduced. Further, when the distance W4 between the two adjacent front electrodes 141 is equal to or less than about 0.8 cm, an amount of the carriers loss due to the distance between the two adjacent front electrodes 141 being longer than the movement distance of carriers decreases.

Figure 4:
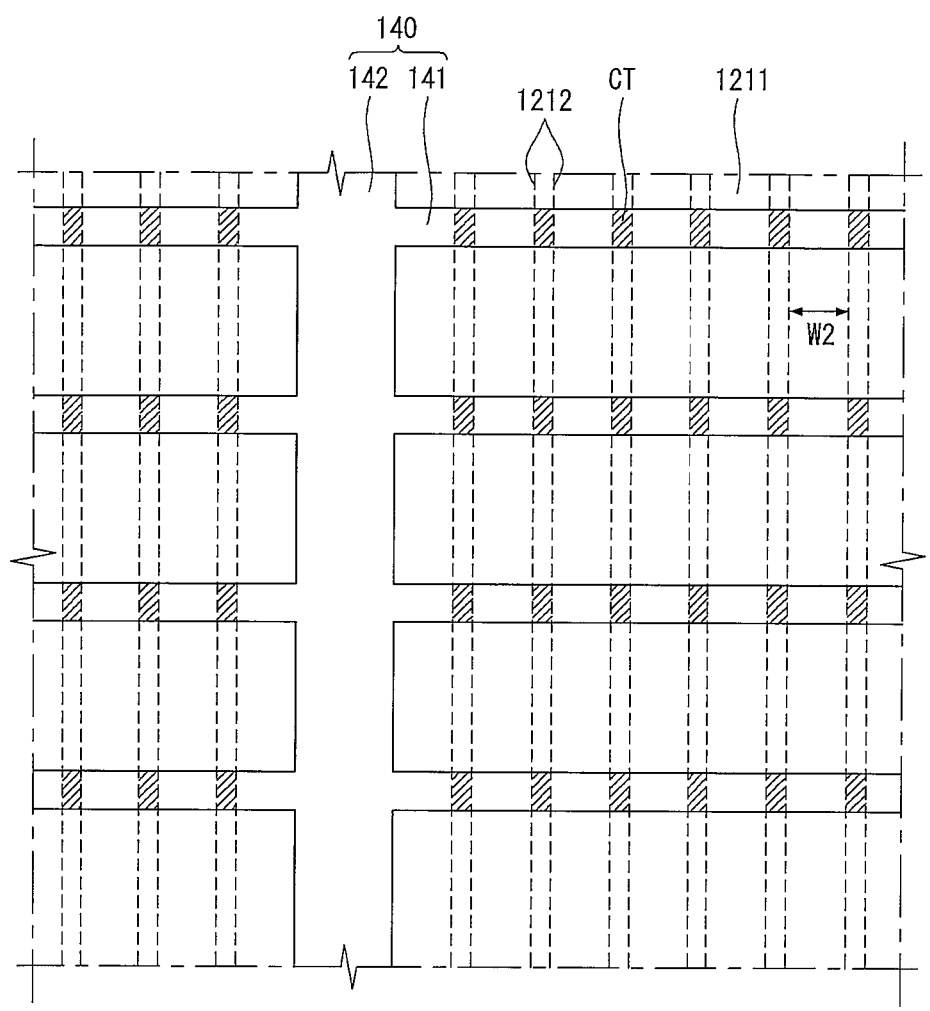
FIG. 4 is a plane view of a front electrode part and an emitter region underlying the front electrode part according to an example embodiment of the invention.

The plurality of front electrodes 141 extend in a direction crossing the plurality of second impurity doped regions 1212 (i.e., the semiconductor electrodes). Thus, as shown in FIG. 4, each front electrode 141 is electrically and physically connected to the plurality of second impurity doped regions 1212 in portions CT (hereinafter, referred to as "contact portions") overlapping the plurality of second impurity doped regions 1212.

In other words, each front electrode 141 directly adjoins the first impurity doped region 1211 except at the overlapping portions between the second impurity doped regions 1212 and each front electrode 141.

The front electrodes 141 collect carriers (for example, electrons) moving through the first impurity doped region 1211 adjoining the front electrodes 141. Because the front electrodes 141 are connected to the second impurity doped regions 1212 in the contact portions CT, carriers moving along the second impurity doped regions 1212 are collected by the front electrodes 141 through the contact portions CT.

As above, because the second impurity doped regions 1212 (i.e., the semiconductor electrodes) are formed in a non-formation area of the front electrodes 141 in a direction crossing the front electrodes 141, the movement distance of carriers reaching the electrode (i.e., the front electrodes 141 or the second impurity doped regions 1212) shortens. Thus, when the carriers move to the front electrodes 141 or the second impurity doped regions 1212, an amount of carriers lost by the impurities or the defect decreases because of a reduction in the movement distance of the carriers.

As shown in FIGS. 1, 2 and 4, only the front electrodes 141 intersect the second impurity doped regions 1212, and the front bus bars 142 are parallel to the second impurity doped regions 1212. In embodiments of the invention, a cross sectional shape of the second impurity doped regions 1212 need not be rectangular, and may be semicircular or other shapes. Additionally, as shown in FIG. 4, each of the plurality of the second impurity doped regions 1212 may intersect a plurality of the front electrodes 141. In other embodiments, at least one of the plurality of the second impurity doped regions 1212 may have at least one disconnected section so that the at least one of the plurality of the second impurity doped regions 1212 do not connect adjacent front electrodes 141.

Most of the transparent anti-reflection layer 130 exists on the second impurity doped regions 1212. The front electrodes 141, which contain a metal material, such as Ag, and reducing the incident area of light, are only locally positioned on the second impurity doped regions 1212. Thus, a reduction of the incident area resulting from the second impurity doped regions 1212 is not generated. On the other hand, as described above, an amount of carriers moving to the front electrodes 141 greatly increases because of the reduction in the movement distance of the carriers and the reduction in the loss amount of carriers without reducing the incident area of light.

As described above, the width W1 of each second impurity doped region 1212 is about 20 μm to 40 μm. When the width W1 of the second impurity doped region 1212 is equal to or greater than about 20 μm, the second impurity doped region 1212 having the desired width W1 is easily and stably designed.

Further, as the doping concentration of impurities increases, an amount of carriers lost by the impurities increases. Thus, when the width W1 of the second impurity doped region 1212 is equal to or less than about 40 μm, an amount of carriers lost by the impurities decreases by an increase in the formation area of the second impurity doped regions 1212 being heavily doped regions. In other words, when the width W1 of the second impurity doped region 1212 is equal to or less than about 40 μm, a transfer rate of carriers to the front electrodes 141 increases because carriers collected in the second impurity doped regions 1212 stably move to the front electrodes 141.

When the distance W2 between the two adjacent second impurity doped regions 1212 is equal to or greater than about 0.02 cm, an amount of carriers lost by the high impurity concentration of the second impurity doped region 1212 decreases. When the distance W2 between the two adjacent second impurity doped regions 1212 is equal to or less than about 0.25 cm, a loss amount of carriers moving to the second impurity doped regions 1212 decreases by stably compensating for the movement distance of the carriers.

Accordingly, the distance W4 between the two adjacent front electrodes 141 may vary depending on changes in the distance W2 between the two adjacent second impurity doped regions 1212.

More specifically, when the distance W2 between the two adjacent second impurity doped regions 1212 decreases, the number of second impurity doped regions 1212 increases and the movement distance of the carriers shortens. Thus, even if the distance W4 between the two adjacent front electrodes 141 lengthens, a collection amount of carriers does not decrease because of the increase in the formation area of the second impurity doped regions 1212. In this instance, the formation area of the front electrodes 141 can be decreased because of an increase in the distance W4 between the front electrodes 141, and the incident area of light increases. Thus, an amount of light incident on the substrate 110 also increases.

As discussed above, because the distance W4 between the two adjacent front electrodes 141 varies depending on changes in the distance W2 between the two adjacent second impurity doped regions 1212, a power gain of the solar cell according to the embodiment of the invention depending on changes in the distance W2 between the two adjacent second impurity doped regions 1212 and the distance W4 between the two adjacent front electrodes 141 is described with reference to FIG. 5.

Figure 5:
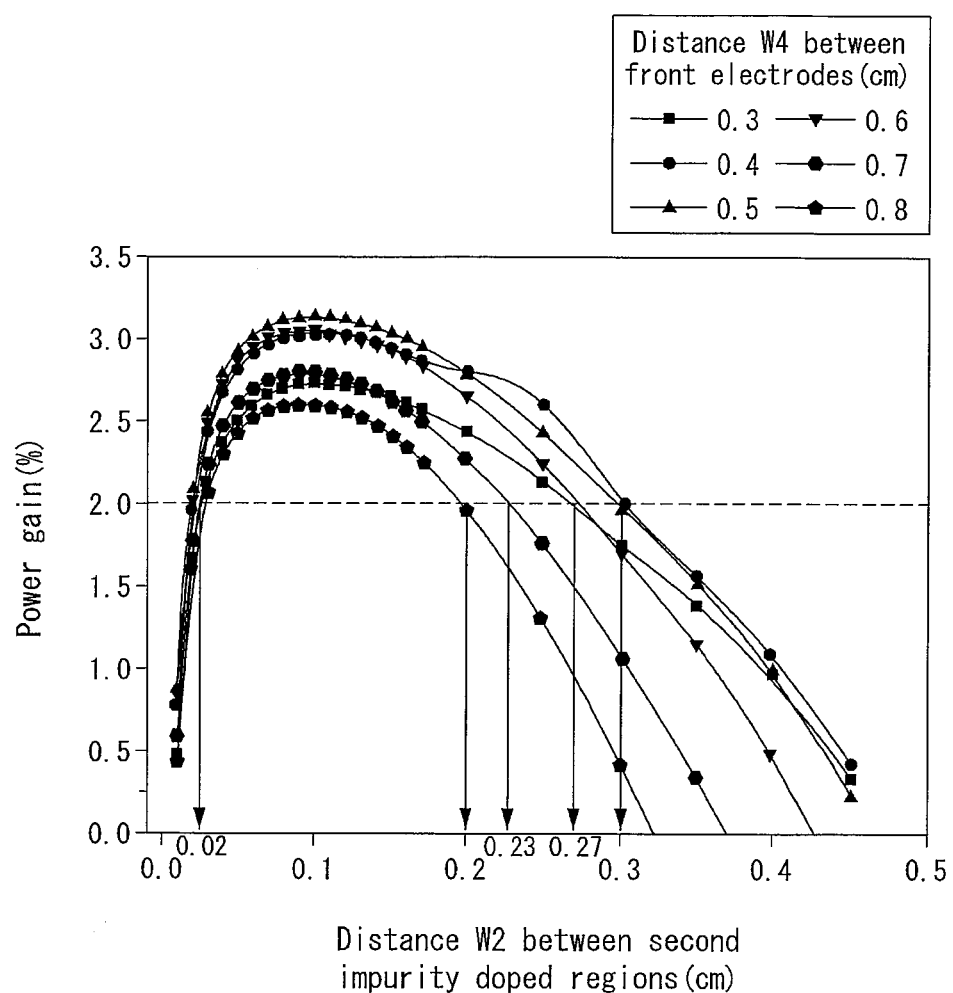
FIG. 5 is a graph illustrating changes in electric power of a solar cell according to an example embodiment of the invention depending on changes in a distance between two adjacent front electrodes and a distance between two adjacent second impurity doped regions.

In the solar cell according to the embodiment of the invention illustrated in FIG. 5, the first impurity doped region had the sheet resistance of about 90 Ω/sq., and the second impurity doped region had the sheet resistance of about 5 Ω/sq. A solar cell according to a comparative example illustrated in FIG. 5 did not include the second impurity doped region serving as the semiconductor electrode. In the comparative example, an emitter region had a sheet resistance of about 90 Ω/sq., and a distance between front electrodes was about 0.21 cm.

In FIG. 5, the power gain indicates an increased percentage of electric power of the solar cell according to the embodiment of the invention based on the solar cell according to the comparative example. For example, the power gain of 0% indicates that the electric power output by the solar cell according to the comparative example was substantially equal to the electric power output by the solar cell according to the embodiment of the invention. The power gain of 2% indicates that the electric power of the solar cell according to the embodiment of the invention increased by 2% compared to the solar cell according to the comparative example.

FIG. 5 is a graph measuring the distance W4 between the two adjacent front electrodes 141 in which the electric power of the solar cell according to the embodiment of the invention increased by 2% compared to the solar cell according to the comparative example when the distance W2 between the two adjacent second impurity doped regions 1212 changed from 0.02 cm to 0.3 cm.

As shown in FIG. 5, when the distance W2 between the two adjacent second impurity doped regions 1212 was kept to be 0.02 cm to 0.3 cm, the distance W4 between the two adjacent front electrodes 141 was kept to be 0.3 cm to 0.8 cm.

More specifically, as shown in FIG. 5, when the distance W2 between the two adjacent second impurity doped regions 1212 was about 0.02 cm to 0.2 cm, the electric power equal to or greater than about 2% increase is obtained when the distance W4 between the two adjacent front electrodes 141 was about 0.3 cm to 0.8 cm.

When the distance W2 between the two adjacent second impurity doped regions 1212 was greater than about 0.2 cm and equal to or less than to 0.23 cm, the electric power equal to or greater than about 2% increase is obtained when the distance W4 between the two adjacent front electrodes 141 was about 0.3 cm to 0.7 cm.

When the distance W2 between the two adjacent second impurity doped regions 1212 was greater than about 0.23 cm and equal to or less than to 0.27 cm, the electric power equal to or greater than about 2% increase is obtained when the distance W4 between the two adjacent front electrodes 141 was about 0.3 cm to 0.6 cm.

When the distance W2 between the two adjacent second impurity doped regions 1212 was greater than about 0.27 cm and equal to or less than to 0.3 cm, the electric power equal to or greater than about 2% increase is obtained when the distance W4 between the two adjacent front electrodes 141 was about 0.4 cm to 0.5 cm.

As shown in FIG. 5, as described above, as the distance W2 between the two adjacent second impurity doped regions 1212 decreases, the efficiency of the solar cell may increase by reducing the distance W4 between the two adjacent front electrodes 141.

Accordingly, when the distance W4 between the two adjacent front electrodes 141 is less about 0.3 cm, the movement distance of the carriers decreases. However, the light incident area of the substrate 110 decreases because of an increase in the number of front electrodes 141. Namely, the front electrodes 141 contain the metal material, and thus, block light that is incident on the substrate 110. Hence, the light incident area of the substrate 110 decreases by an increase in the formation area of the front electrodes 141. As a result, an amount of light that is incident on the substrate 110 decreases by the increase in the formation area of the front electrodes 141, and an amount of carriers (i.e., electrons and holes) produced in the substrate 110 decreases. Further, an amount of short-circuit current Isc flowing in the solar cell 11 decreases, and the electric power generated by the solar cell 11 decreases.

Further, when the distance W4 between the two adjacent front electrodes 141 is greater about 0.8 cm, the movement distance of the carriers increases by an increase in the distance W4 between the front electrodes 141. Hence, an amount of carriers lost during the movement of the carriers to the front electrodes 141 increases, and the front electrodes 141 cannot smoothly collect the carriers moving along the second impurity doped regions 1212. As a result, the electric power generated by the solar cell 11 decreases.

Based on the graph illustrated in FIG. 5, when the distance W2 between the two adjacent second impurity doped regions 1212 is within the range of about 0.02 cm to 0.3 cm, the distance W4 between the two adjacent front electrodes 141 may be within the range of about 0.3 cm to 0.8 cm.

As can be seen from FIG. 5, when the increased percentage in the electric power of the solar cell according to the embodiment of the invention depending on changes in the distance W2 between the second impurity doped regions 1212 and the distance W4 between the front electrodes 141 is equal to or greater than about 2% compared to the solar cell according to the comparative example, the increase effect of the electric power of the solar cell can be stably obtained.

The plurality of front bus bars 142 are electrically and physically connected to the first impurity doped region 1211 and extend substantially parallel to one another in a direction crossing (i.e., perpendicular to, or intersects) the front electrodes 141. Further, as shown in FIG. 4, the front bus bars 142 extend in the same direction as the second impurity doped regions 1212. Hence, the front bus bars 142 adjoin only the first impurity doped region 1211, unlike the front electrodes 141.

In this instance, the front bus bars 142 are electrically and physically connected to the front electrodes 141 at crossings of the front electrodes 141 and the front bus bars 142.

Accordingly, as shown in FIG. 1, the plurality of front electrodes 141 have a stripe shape extending in a transverse (or longitudinal) direction, and the plurality of front bus bars 142 have a stripe shape extending in a longitudinal (or transverse) direction. Hence, the front electrode part 140 has a lattice shape on the front surface of the substrate 110.

The front bus bars 142 collect not only carriers moving from the first impurity doped region 1211 contacting the front bus bars 142 but also the carriers collected by the front electrodes 141.

The plurality of front bus bars 142 are connected to an external device and output the collected carriers (for example, electrons) to the external device.

Because the front bus bars 142 collect and transfer the carriers collected by the front electrodes 141 in a desired direction, a width of each of the front bus bars 142 is greater than a width of each of the front electrodes 141.

Each of the front bus bars 142 has a width W5 of about 1.5 mm to 2 mm.

As above, because the front electrode part 140 is connected to the first impurity doped region 1211 having the relatively low impurity doping concentration in a portion of the impurity doped region 121, which mostly carries out the movement of the carriers to the front electrode part 140, an amount of carriers lost by the impurities decreases. Hence, the mobility of carriers is improved. Further, because a portion of each front electrode 141 is connected to the second impurity doped regions 1212 having the relatively high impurity doping concentration, the conductive from the second impurity doped regions 1212 to the front electrodes 141 is improved. Hence, a transfer amount of the carriers moving from the second impurity doped regions 1212 to the front electrodes 141 increases, and the efficiency of the solar cell 11 increases.

In the embodiment of the invention, because the anti-reflection layer 130 is formed of silicon nitride (SiNx) having the characteristic of positive fixed charges, the carrier transfer efficiency from the substrate 110 to the front electrode part 140 when the substrate 110 is of the p-type is improved. In other words, because the anti-reflection layer 130 has the positive charge characteristic, the anti-reflection layer 130 reduces or prevents a movement of holes corresponding to positive charges.

More specifically, when the substrate 110 is of the p-type and the anti-reflection layer 130 has the positive charge characteristic, electrons corresponding to negative charges moving to the anti-reflection layer 130 have the polarity opposite the anti-reflection layer 130. Therefore, the electrons are drawn to the anti-reflection layer 130 due to the polarity of the anti-reflection layer 130, and the holes having the same polarity as the anti-reflection layer 130 are pushed out of the anti-reflection layer 130 due to the polarity of the anti-reflection layer 130.

Accordingly, an amount of electrons moving from the substrate 110 to the front electrode part 140 increases due to silicon nitride (SiNx) having the positive polarity, and the movement of undesired carriers (for example, holes) is efficiently reduced or prevented. As a result, an amount of carriers recombined at the front surface of the substrate 110 further decreases.

In the embodiment of the invention, the front bus bars 142 are formed of the same material as the front electrodes 141. However, such is not required, and in another embodiment of the invention, the front bus bars 142 and the front electrodes 141 may be formed of different materials.

The BSF region 172 is a region (for example, a $p^+$-type region) that is more heavily doped than the substrate 110 with impurities of the same conductive type as the substrate 110.

A potential barrier is formed by a difference between impurity concentrations of a first conductive region (for example, a p-type region) of the substrate 110 and the BSF region 172. Hence, the potential barrier prevents or reduces electrons from moving to the BSF region 172 used as a moving path of holes and makes it easier for the holes to move to the BSF region 172. Thus, the BSF region 172 reduces an amount of carriers lost by a recombination and/or a disappearance of the electrons and the holes at and around the back surface of the substrate 110, and accelerates a movement of desired carriers (for example, holes), thereby increasing the movement of carriers to the back electrode part 150.

The back electrode part 150 includes a back electrode 151 and a plurality of back bus bars 152 connected to the back electrode 151.

The back electrode 151 contacts the BSF region 172 positioned at the back surface of the substrate 110 and is substantially positioned on the entire back surface of the substrate 110. In an alternative example, the back electrode 151 may be not positioned at an edge of the back surface of the substrate 110.

The back electrode 151 contains a conductive material, for example, aluminum (Al).

The back electrode 151 collects carriers (for example, holes) moving to the BSF region 172.

Because the back electrode 151 contacts the BSF region 172 having the impurity concentration higher than the substrate 110, a contact resistance between the substrate 110 (i.e., the BSF region 172) and the back electrode 151 decreases. Hence, the transfer efficiency of carriers from the substrate 110 to the back electrode 151 is improved.

The plurality of back bus bars 152 are positioned on the back electrode 151 and are connected to the back electrode 151.

Further, the plurality of back bus bars 152 are positioned opposite the plurality of front bus bars 142 with the substrate 110 interposed therebetween. The plurality of back bus bars 152 and the plurality of front bus bars 142 may be aligned.

The plurality of back bus bars 152 collect carriers transferred from the back electrode 151 in the same manner as the plurality of front bus bars 142.

The plurality of back bus bars 152 are connected to the external device and output the carriers (for example, holes) collected by the back bus bars 152 to the external device.

The plurality of back bus bars 152 may be formed of a material having better conductivity than the back electrode 151. The plurality of back bus bars 152 may contain at least one conductive material, for example, silver (Ag).

In an alternative example, the back bus bars 152 may be positioned right on the back surface of the substrate 110 and may adjoin the back electrode 151. In this instance, the BSF region 172 may be not positioned at portions of the back surface of the substrate 110 that adjoins the back bus bars 152.

An operation of the solar cell 11 having the above-described structure is described below.

When light irradiated to the solar cell 11 is incident on the impurity doped region 121 and the substrate 110, which are the semiconductor parts, through the anti-reflection layer 130, a plurality of electron-hole pairs are generated in the semiconductor parts 110 and 121 by light energy produced based on the incident light. In this instance, because a reflection loss of the light incident on the substrate 110 is reduced by the anti-reflection layer 130, an amount of light incident on the substrate 110 increases.

The electron-hole pairs are separated into electrons and holes by the p-n junction of the substrate 110 and the impurity doped region 121. Then, the separated electrons move to the n-type semiconductor part, for example, the impurity doped region 121, and the separated holes move to the p-type semiconductor part, for example, the substrate 110. The electrons moving to the impurity doped region 121 are collected by the front electrodes 141 and the front bus bars 142 and then move along the front bus bars 142. The holes moving to the substrate 110 are collected by the back electrode 151 and the back bus bars 152 and then move along the back bus bars 152. When the front bus bars 142 are connected to the back bus bars 152 using electric wires, current flows therein to thereby enable use of the current for electric power.

In the embodiment of the invention, carriers moving through the impurity doped region 121 move to not only the front electrodes 141 or the front bus bars 142, but also to the second impurity doped regions 1212 by forming the second impurity doped regions 1212 (i.e., the semiconductor electrodes) having the relatively high impurity doping concentration in the direction crossing the front electrodes 141. Thus, the movement distance of the carriers moving to the front electrodes 141, the front bus bars 142, or the second impurity doped regions 1212 decreases, and an amount of carriers moving to the front electrode part 140 or the second impurity doped regions 1212 increases. Further, because the second impurity doped regions 1212 contacting the front electrodes 141 have the high impurity doping concentration of high conductivity, the conductivity from the second impurity doped regions 1212 to the front electrodes 141 and the contact resistance between the second impurity doped regions 1212 and the front electrodes 141 decrease. Hence, the carrier transfer rate from the second impurity doped regions 1212 to the front electrodes 141 increases, and an amount of carriers transferred from the impurity doped region 121 to the front bus bars 142 increases. As a result, the efficiency of the solar cell 11 is improved.

Figure 6:
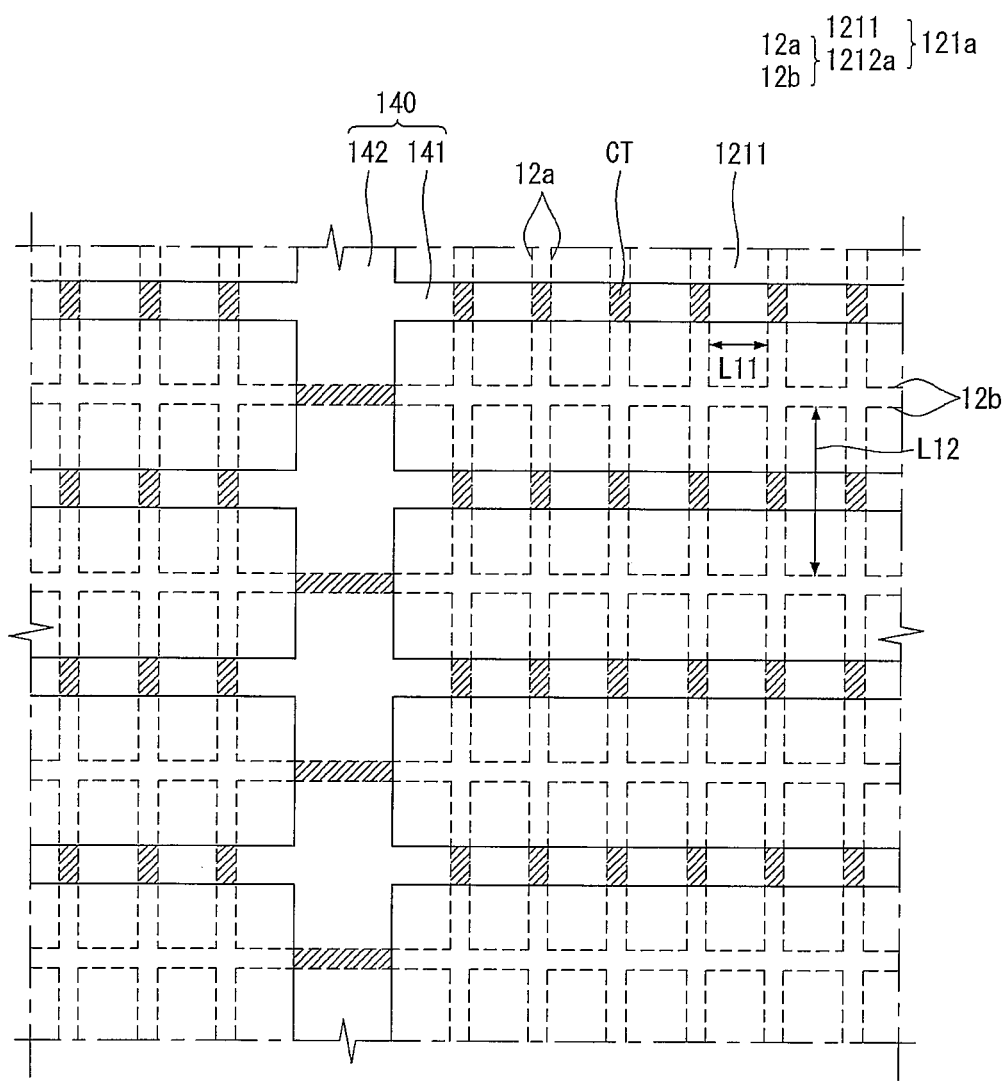
FIG. 6 is a plane view of a front electrode part and an emitter region underlying the front electrode part in a solar cell according to another example embodiment of the invention.

FIG. 6 illustrates a solar cell according to another example embodiment of the invention. Since configuration of the solar cell shown in FIG. 6 is substantially the same as the solar cell shown in FIGS. 1 to 4, except an impurity doped region including first and second impurity doped regions each having a different impurity doping thickness, a different impurity doping concentration, and a different sheet resistance, a further description may be briefly made or may be entirely omitted.

As shown in FIG. 6, the solar cell includes an impurity doped region 121a including first and second impurity doped regions 1211 and 1212a each having a different impurity doping thickness, a different impurity doping concentration, and a different sheet resistance, and a front electrode part 140 including a plurality of front electrodes 141 and a plurality of front bus bars 142 extending in a direction crossing the plurality of front electrodes 141.

As described above, the sheet resistance of the first impurity doped region 1211 may be approximately 70 Ω/sq. to 90 Ω/sq., and the sheet resistance of each of the plurality of second impurity doped regions 1212a may be approximately 5 Ω/sq. to 15 Ω/sq.

Each of the second impurity doped regions 1212a includes a first portion 12a, which extends in a first direction, for example, a direction parallel to the front bus bars 142, and a second portion 12b, which extends in a second direction different from the first direction, for example, a direction parallel to the front electrodes 141. The first portion 12a of the second impurity doped region 1212a shown in FIG. 6 may correspond to the second impurity doped region 1212 shown in FIGS. 1 to 4. Thus, the impurity doped region 121a has a lattice shape in the same manner as the front electrode part 140 and is positioned at the front surface of the substrate 110.

At least one second portion 12b of the second impurity doped region 1212a exists between the two adjacent front electrodes 141. Thus, the at least one second portion 12b and the front electrodes 141 are positioned on different parallel lines.

Because the second impurity doped regions 1212a have the lattice shape unlike the solar cell shown in FIGS. 1 to 4, a formation area of the second impurity doped regions 1212a on the front surface of the substrate 110 is greater than the formation area of the second impurity doped regions 1212 shown in FIGS. 1 to 4 by a formation area of the second portions 12b. Hence, a movement distance of carriers moving from the first impurity doped region 1211 to the second impurity doped regions 1212a further decreases, compared to the solar cell shown in FIGS. 1 to 4. Thus, a distance between the first portions 12a of the second impurity doped region 1212a may be greater than the distance between the second impurity doped regions 1212 shown in FIGS. 1 to 4. Further, because the formation area of the second impurity doped regions 1212a increases compared to the second impurity doped regions 1212 shown in FIGS. 1 to 4, a distance W4 between the two adjacent front electrodes 141 increases compared to the distance W4 shown in FIGS. 1 to 4.

As above, the second impurity doped regions 1212a includes the second portions 12b extending parallel to the front electrodes 141, and thus, the second portions 12b extend across the front bus bar 142. Thus, as shown in FIG. 6, the front bus bar 142 adjoins the second portion 12b of the second impurity doped region 1212a at a crossing between the front bus bar 142 and the second portion 12b, and adjoins the first impurity doped region 1211 in a remaining portion. Although FIG. 6 shows the front bus bar 142 intersecting the second portion 12b of the second impurity doped region 1212a, in other embodiments, the second portion 12b need not be formed at portions of the substrate 110 where the front bus bar 142 are formed. Thus, in this instance, the front bus bar 142 do not intersect the second portion 12b of the second impurity doped region 1212a.

In this instance, carriers transferred through the second portions 12b of the second impurity doped regions 1212a move to the first electrodes 141, which adjoin the first portions 12a along the first portions 12a at crossings between the first and second portions 12a and 12b, or move to the front bus bars 142 adjoining the second portions 12b.

As above, with an increase in the formation area of the second impurity doped regions 1212a, which serve as the semiconductor electrodes, collect carriers positioned in the first impurity doped region 1211, and transfer the carriers to the first electrodes 141 or the front bus bars 142 adjoining the second impurity doped regions 1212a, the movement distance of the carriers further decreases. Thus, as described above, the distance W4 between the two adjacent front electrodes 141 and a distance L11 (W2 in FIGS. 1 to 4) between the two adjacent first portions 12a increase compared to the solar cell shown in FIGS. 1 to 4. Therefore, the margin of the distance W4 between the front electrodes 141 and the margin of the distance L11 between the first portions 12a increase.

In the embodiment of the invention, the distance L11 between the two adjacent first portions 12a may be about 0.01 cm to 0.35 cm, and the distance W4 between the two adjacent front electrodes 141 may be about 0.2 cm to 1.2 cm. Further, a distance L12 between the two adjacent second portions 12b may be about 0.01 cm to 0.4 cm.

Changes in electric power of the solar cell depending on changes in the distance L11 between the two adjacent first portions 12a, the distance L12 between the two adjacent second portions 12b, and the distance W4 between the two adjacent front electrodes 141 are described below with reference to FIGS. 7 to 9.

Figure 7:
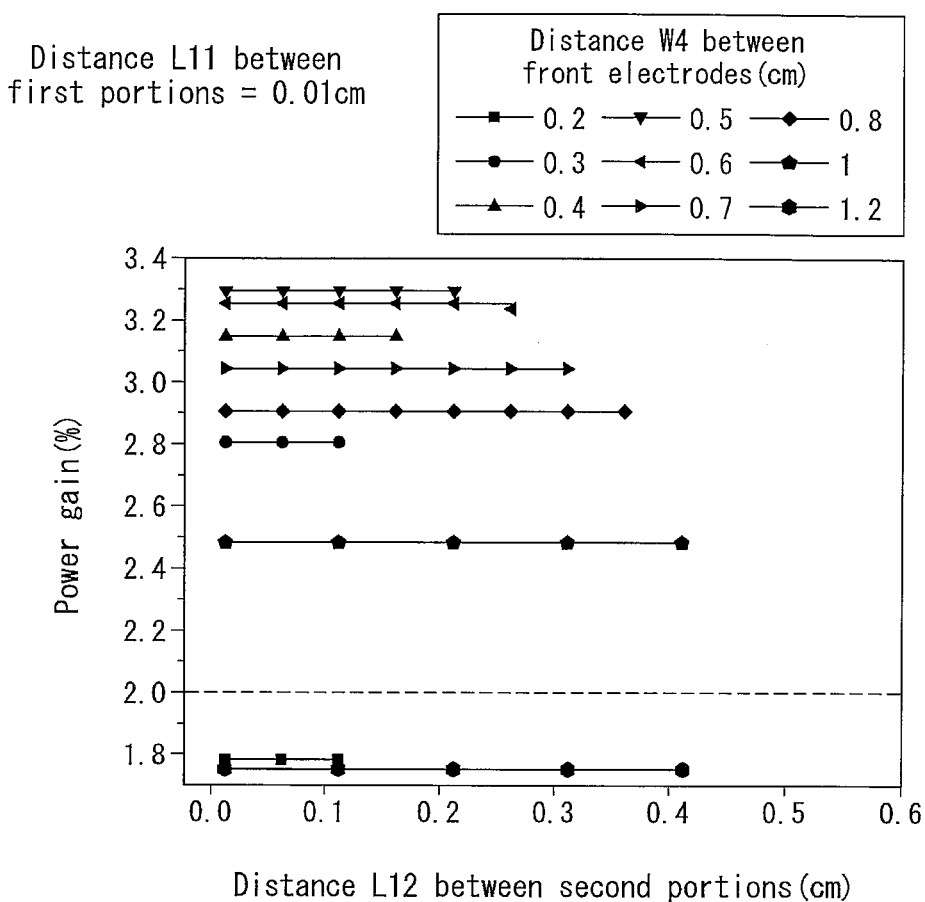
FIGS. 7 to 9 are graphs illustrating changes in electric power of a solar cell depending on changes in a distance between two adjacent first portions, a distance between two adjacent second portions, and a distance between two adjacent front electrodes, whereby.
Figure 8:
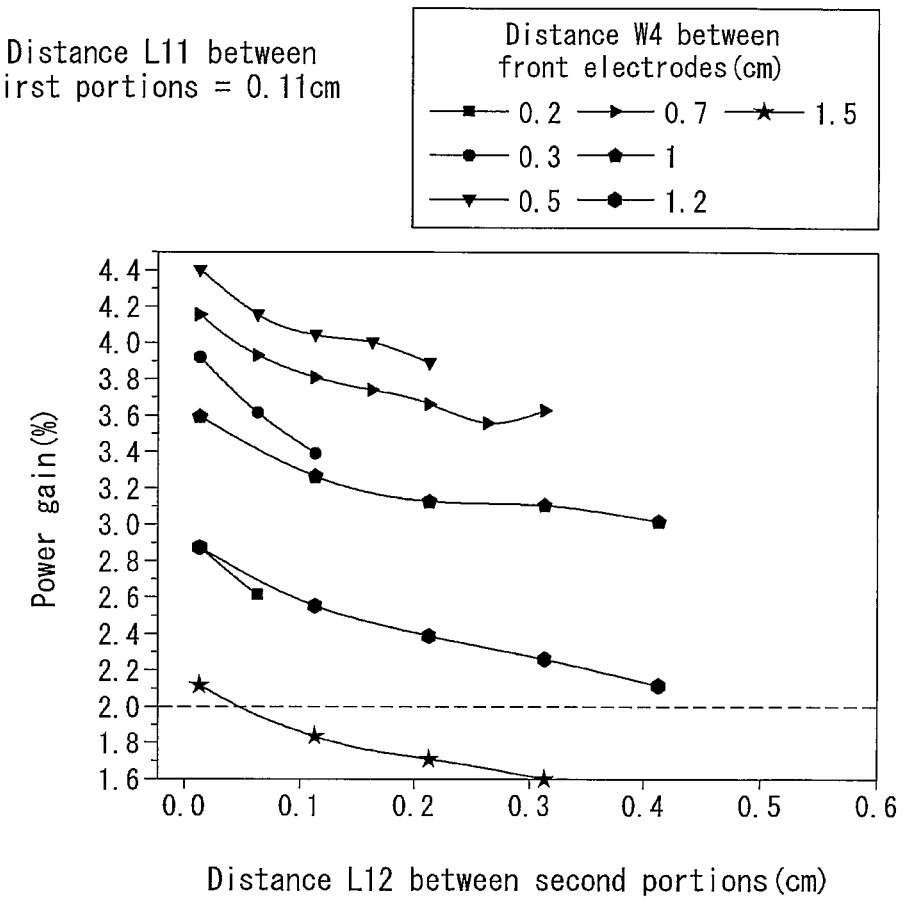
Figure 9:
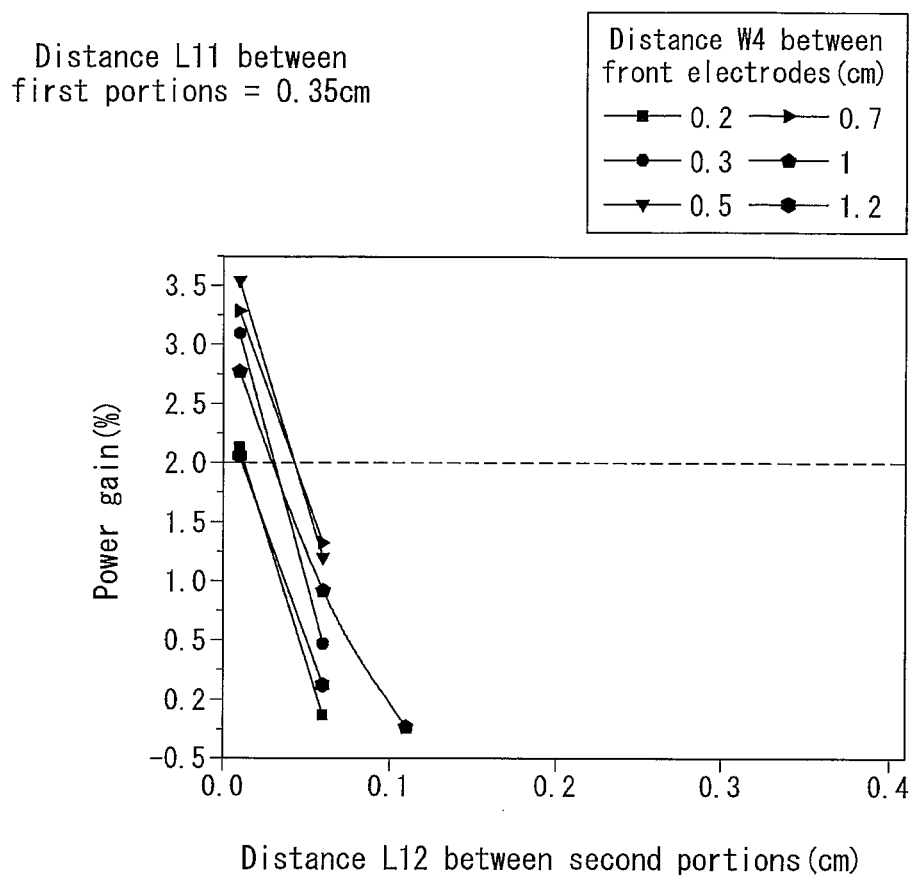

As described above with reference to FIG. 5, a power gain illustrated in FIGS. 7 to 9 indicates an increased percentage of electric power of the solar cell according to the embodiment of the invention based on a solar cell according to a comparative example. The solar cell according to the comparative example did not include the second impurity doped region serving as the semiconductor electrode. In the comparative example, an emitter region had a sheet resistance of about 90 Ω/sq., and a distance between front electrodes was about 0.21 cm.

FIG. 7 is a graph illustrating changes in electric power of the solar cell depending on changes in the distance L12 between the two adjacent second portions 12b and the distance W4 between the two adjacent front electrodes 141 when the distance L11 between the two adjacent first portions 12a is about 0.01 cm.

As shown in FIG. 7, when the distance L12 between the two adjacent second portions 12b changed from about 0 cm to 0.4 cm and the distance W4 between the two adjacent front electrodes 141 was within the range of about 0.2 cm to 1.2 cm, an increased percentage of electric power of the solar cell according to the embodiment of the invention was about 1.8% to 3.3%. In this instance, when the increase effect of the electric power of the solar cell was stably obtained by obtaining the power increased percentage equal to or greater than about 2%, the distance W4 between the two adjacent front electrodes 141 was about 0.3 cm to 1 cm.

Accordingly, when the distance L11 between the two adjacent first portions 12a is about 0.01 cm, the distance L12 between the two adjacent second portions 12b is about 0.01 cm to 0.4 cm and the distance W4 between the two adjacent front electrodes 141 may be about 0.3 cm to 1 cm.

FIG. 8 is a graph illustrating changes in electric power of the solar cell depending on changes in the distance L12 between the two adjacent second portions 12b and the distance W4 between the two adjacent front electrodes 141 when the distance L11 between the two adjacent first portions 12a is about 0.11 cm. As shown in FIG. 8, when the distance L12 between the two adjacent second portions 12b changed from about 0.1 cm to 0.4 cm and the distance W4 between the two adjacent front electrodes 141 was within the range of about 0.2 cm to 1.5 cm, an increased percentage of electric power of the solar cell according to the embodiment of the invention was about 1.6% to 4.4%. In this instance, when the power increased percentage equal to or greater than about 2% was obtained, the distance W4 between the two adjacent front electrodes 141 was about 0.2 cm to 1.2 cm.

Accordingly, when the distance L11 between the two adjacent first portions 12a is about 0.11 cm, the distance L12 between the two adjacent second portions 12b is about 0.01 cm to 0.4 cm and the distance W4 between the two adjacent front electrodes 141 may be about 0.2 cm to 1.2 cm.

FIG. 9 is a graph illustrating changes in electric power of the solar cell depending on changes in the distance L12 between the two adjacent second portions 12b and the distance W4 between the two adjacent front electrodes 141 when the distance L11 between the two adjacent first portions 12a is about 0.35 cm. As shown in FIG. 9, when the distance L12 between the two adjacent second portions 12b changed from about 0.1 cm to 0.12 cm and the distance W4 between the two adjacent front electrodes 141 was within the range of about 0.2 cm to 1.2 cm, an increased percentage of electric power of the solar cell according to the embodiment of the invention was about 0.5% to 3.5%. In this instance, when the power increased percentage equal to or greater than about 2% was obtained, the distance W4 between the two adjacent front electrodes 141 was about 0.2 cm to 1.0 cm.

Accordingly, when the distance L11 between the two adjacent first portions 12a is about 0.35 cm, the distance L12 between the two adjacent second portions 12b is about 0.01 cm to 0.05 cm and the distance W4 between the two adjacent front electrodes 141 may be about 0.1 cm to 1.0 cm.

In the embodiment of the invention, because the second impurity doped regions have the lattice shape, the electric power of the solar cell further increases compared to the solar cell shown in FIGS. 1 to 4.

For example, the power gain in FIG. 5 was obtained up to about 3.2%, and the power gain in FIGS. 7 to 9 was obtained up to about 4.4%.

In the embodiments of the invention, the distance between the two adjacent front electrodes 141, the number of second impurity doped regions 1212 (or 1212a) positioned between the two adjacent front electrodes 141, the distance between the two adjacent portions (12a or 12b), the number of front bus bars, etc., may be variously changed.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell comprising:
a substrate of a first conductive type;
an emitter region, which is positioned at the substrate and is doped with impurities of a second conductive type opposite the first conductive type;
a plurality of first electrodes, which are connected to the emitter region and extend parallel to one another to be spaced apart from one another;
a first bus bar, which is connected to the plurality of first electrodes at crossings of the plurality of first electrodes and the first bus bar, and the emitter region, and is disposed in a first direction;
a plurality of semiconductor electrodes including a plurality of first portions, which extend in the first direction, and a plurality of second portions, which extend in a second direction different from the first direction, the plurality of semiconductor electrodes each having an impurity doping concentration higher than the emitter region; and
a second electrode connected to the substrate,
wherein at least one of the second portions of the plurality of semiconductor electrodes is disposed between two adjacent first electrodes, and each of the plurality of second portions is not overlapped with the plurality of first electrodes,
the first direction is the same as an extension direction of the first bus bar and the second direction is the same as an extension direction of the plurality of first electrodes, and the first direction crossing the second direction,
a distance between the two adjacent first electrodes is about 0.2 cm to 1.2 cm, a distance between two adjacent first portions is about 0.01 cm to 0.35 cm, and a distance between two adjacent second portions is about 0.01 cm to 0.4 cm, and
wherein upper surfaces of the plurality of semiconductor electrodes and an upper surface of the emitter region are coplanar.

2. The solar cell of claim 1, wherein the emitter region has a sheet resistance of about 70 $\Omega$/sq. to 90 $\Omega$/sq., and each of the plurality of semiconductor electrodes has a sheet resistance of about 5 $\Omega$/sq. to 15 $\Omega$/sq.

3. The solar cell of claim 1, wherein each of the plurality of first electrodes has a width of about 80 μm to 120 μm.

4. The solar cell of claim 1, wherein each of the plurality of semiconductor electrodes has a width of about 20 μm to 40 μm.

5. The solar cell of claim 1, wherein a thickness of the plurality of semiconductor electrodes is greater than a thickness of the plurality of first electrodes.

6. The solar cell of claim 1, wherein each of the plurality of first portions periodically intersect the plurality of first electrodes, and each of the plurality of first electrodes periodically intersect the plurality of the first portions.

* * * * *